United States Patent
Shim et al.

(10) Patent No.: US 8,072,059 B2
(45) Date of Patent: Dec. 6, 2011

(54) SEMICONDUCTOR DEVICE AND METHOD OF FORMING UBM FIXED RELATIVE TO INTERCONNECT STRUCTURE FOR ALIGNMENT OF SEMICONDUCTOR DIE

(75) Inventors: Il Kwon Shim, Singapore (SG); Seng Guan Chow, Singapore (SG); Yaojian Lin, Singapore (SG); Rui Huang, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 240 days.

(21) Appl. No.: 12/476,447

(22) Filed: Jun. 2, 2009

(65) Prior Publication Data

US 2009/0236686 A1    Sep. 24, 2009

Related U.S. Application Data

(63) Continuation-in-part of application No. 12/042,026, filed on Mar. 4, 2008, now Pat. No. 7,993,972, and a continuation-in-part of application No. 11/379,332, filed on Apr. 19, 2006, now Pat. No. 7,859,098.

(60) Provisional application No. 61/058,175, filed on Jun. 2, 2008.

(51) Int. Cl.
*H01L 23/04* (2006.01)

(52) U.S. Cl. . 257/698; 257/778; 257/779; 257/E23.011; 257/E21.503; 438/108

(58) Field of Classification Search ............... 257/698, 257/778, 779, E23.011, E21.503; 438/108
See application file for complete search history.

(56) References Cited

U.S. PATENT DOCUMENTS

| | | | |
|---|---|---|---|
| 6,369,455 B1 | 4/2002 | Ho et al. | |
| 6,740,964 B2 | 5/2004 | Sasaki | |
| 6,798,057 B2 | 9/2004 | Bolkin et al. | |
| 6,838,776 B2 | 1/2005 | Leal et al. | |
| 6,867,471 B2 | 3/2005 | Goller et al. | |
| 6,921,975 B2 | 7/2005 | Leal et al. | |
| 6,998,703 B2 | 2/2006 | Di Stefano | |
| 7,045,391 B2 | 5/2006 | Lin | |
| 7,185,426 B1 | 3/2007 | Hiner et al. | |
| 7,190,080 B1 | 3/2007 | Leu et al. | |
| 7,642,128 B1 * | 1/2010 | Lin et al. | 438/106 |
| 2004/0070083 A1 | 4/2004 | Su | |
| 2005/0098879 A1 | 5/2005 | Kim | |
| 2005/0110168 A1 | 5/2005 | Chuang | |
| 2005/0224988 A1 | 10/2005 | Tuominen | |
| 2006/0145331 A1 | 7/2006 | Cho et al. | |
| 2006/0255458 A1 | 11/2006 | Dangelmaier | |
| 2010/0140736 A1 * | 6/2010 | Lin et al. | 257/528 |

* cited by examiner

*Primary Examiner* — Trung Q Dang
(74) *Attorney, Agent, or Firm* — Robert D. Atkins; Patent Law Group (57) ABSTRACT

A semiconductor device is made by forming a first conductive layer over a temporary carrier. A UBM layer is formed over the temporary carrier and fixed in position relative to the first conductive layer. A conductive pillar is formed over the first conductive layer. A semiconductor die is mounted to the UBM layer to align the die relative to the conductive pillar. An encapsulant is deposited over the die and around the conductive pillar. The UBM layer prevents shifting of the semiconductor die while depositing the encapsulant. The temporary carrier is removed. A first interconnect structure is formed over a first surface of the encapsulant. A second interconnect structure is formed over a second surface of the encapsulant. The first and second interconnect structures are electrically connected through the conductive pillar. The first or second interconnect structure includes an integrated passive device electrically connected to the conductive pillar.

25 Claims, 6 Drawing Sheets

FIG. 7 ing a UBM layer over the temporary carrier. The UBM layer is fixed in position relative to the first conductive layer. The method further includes the steps of forming a conductive pillar over the first conductive layer, mounting a semiconductor die to the UBM layer to align the semiconductor die relative to the conductive pillar, and depositing an encapsulant over the semiconductor die and around the conductive pillar. The UBM layer prevents shifting of the semiconductor die while depositing the encapsulant. The method further includes the steps of removing the temporary carrier, forming a first interconnect structure over a first surface of the encapsulant, and forming a second interconnect structure over a second surface of encapsulant opposite the first inter-
SEMICONDUCTOR DEVICE AND METHOD OF FORMING UBM FIXED RELATIVE TO INTERCONNECT STRUCTURE FOR ALIGNMENT OF SEMICONDUCTOR DIE

CLAIM TO DOMESTIC PRIORITY

The present nonprovisional application claims the benefit of priority of U.S. Provisional Application Ser. No. 61/058,175, filed Jun. 2, 2008. The present nonprovisional application is a continuation-in-part of U.S. application Ser. No. 12/042,026, filed Mar. 4, 2008, entitled "Wafer Level Die Integration and Method Therefor" by Yaojian Lin et al. The present nonprovisional application is a continuation-in-part of U.S. application Ser. No. 11/379,332, filed Apr. 19, 2006, entitled "Embedded Integrated Circuit Package System" by You Yang Ong, et al.

FIELD OF THE INVENTION

The present invention relates in general to semiconductor devices and, more particularly, to a semiconductor device and method of forming an interconnect structure with fixed under bump metallization (UBM) layer fixed relative to the interconnect structure for alignment of the semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

When forming wafer-level chip-scale packages (WLCSPs), it is often necessary to form top and bottom interconnection structures in the packages. The top and bottom interconnect structures facilitate the mounting of the WLCSPs to motherboards, and other printed circuit boards (PCBS) or substrates. By forming the interconnect structures on top and bottom surfaces of the package, multiple WLCSPs can be placed over one-another to form stacked packages that provide sophisticated functionality in a small package volume. The top and bottom interconnect structures usually include conductive through silicon vias (TSVs) or conductive through hole vias (THVs). To form TSVs or THVs, a via is cut through the semiconductor material or peripheral region around the semiconductor die. The vias are then filled with an electrically conductive material, for example, copper deposition through an electroplating process. However, the semiconductor die are difficult to align during die attachment and can shift during the encapsulation process, which leads to device failure and lower manufacturing yield.

SUMMARY OF THE INVENTION

A need exists to mount and align semiconductor die between vertical interconnect structures without shifting placement of the die. Accordingly, in one embodiment, the present invention is a method of making a semiconductor device comprising the steps of providing a temporary carrier, forming a first conductive layer over the temporary carrier, and forming a UBM layer over the temporary carrier. The UBM layer is fixed in position relative to the first conductive layer. The method further includes the steps of forming a conductive pillar over the first conductive layer, mounting a semiconductor die to the UBM layer to align the semiconductor die relative to the conductive pillar, and depositing an encapsulant over the semiconductor die and around the conductive pillar. The UBM layer prevents shifting of the semiconductor die while depositing the encapsulant. The method further includes the steps of removing the temporary carrier, forming a first interconnect structure over a first surface of the encapsulant, and forming a second interconnect structure over a second surface of encapsulant opposite the first interconnect structure. The first and second interconnect structures are electrically connected through the conductive pillar.

In another embodiment, the present invention is a method of making a semiconductor device comprising the steps of providing a temporary carrier, forming a first conductive layer over the temporary carrier, and forming a UBM layer over the temporary carrier. The UBM layer is fixed in position relative to the first conductive layer. The method further includes the steps of forming a conductive pillar over the first conductive layer, mounting a semiconductor component to the UBM layer to align the semiconductor component relative to the conductive pillar, depositing an encapsulant over the semiconductor component and around the conductive pillar, removing the temporary carrier, forming a first interconnect structure over a first surface of the encapsulant, and forming a second interconnect structure over a second surface of encapsulant opposite the first interconnect structure. The first and second interconnect structures are electrically connected through the conductive pillar.

In another embodiment, the present invention is a method of making a semiconductor device comprising the steps of forming a first interconnect structure including wettable contact pads and UBM fixed in position relative to the contact pads, forming a conductive pillar over the wettable contact pads of the first interconnect structure, mounting a first semiconductor component to the UBM to align the semiconductor component relative to the conductive pillar, depositing an encapsulant over the semiconductor component and around the conductive pillar, and forming a second interconnect structure over a first surface of the encapsulant opposite the first interconnect structure. The first and second interconnect structures are electrically connected through the conductive pillar.

In another embodiment, the present invention is a semiconductor device comprising a first conductive layer and UBM layer fixed in position relative to the first conductive layer. A conductive pillar is formed over the first conductive layer. A semiconductor component is mounted to the UBM layer to align the semiconductor die relative to the conductive pillar. An encapsulant is deposited over the semiconductor die and around the conductive pillar. A first interconnect structure is formed over a first surface of the encapsulant. A second interconnect structure is formed over a second surface of encapsulant opposite the first interconnect structure. The first and second interconnect structures are electrically connected through the conductive pillar.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
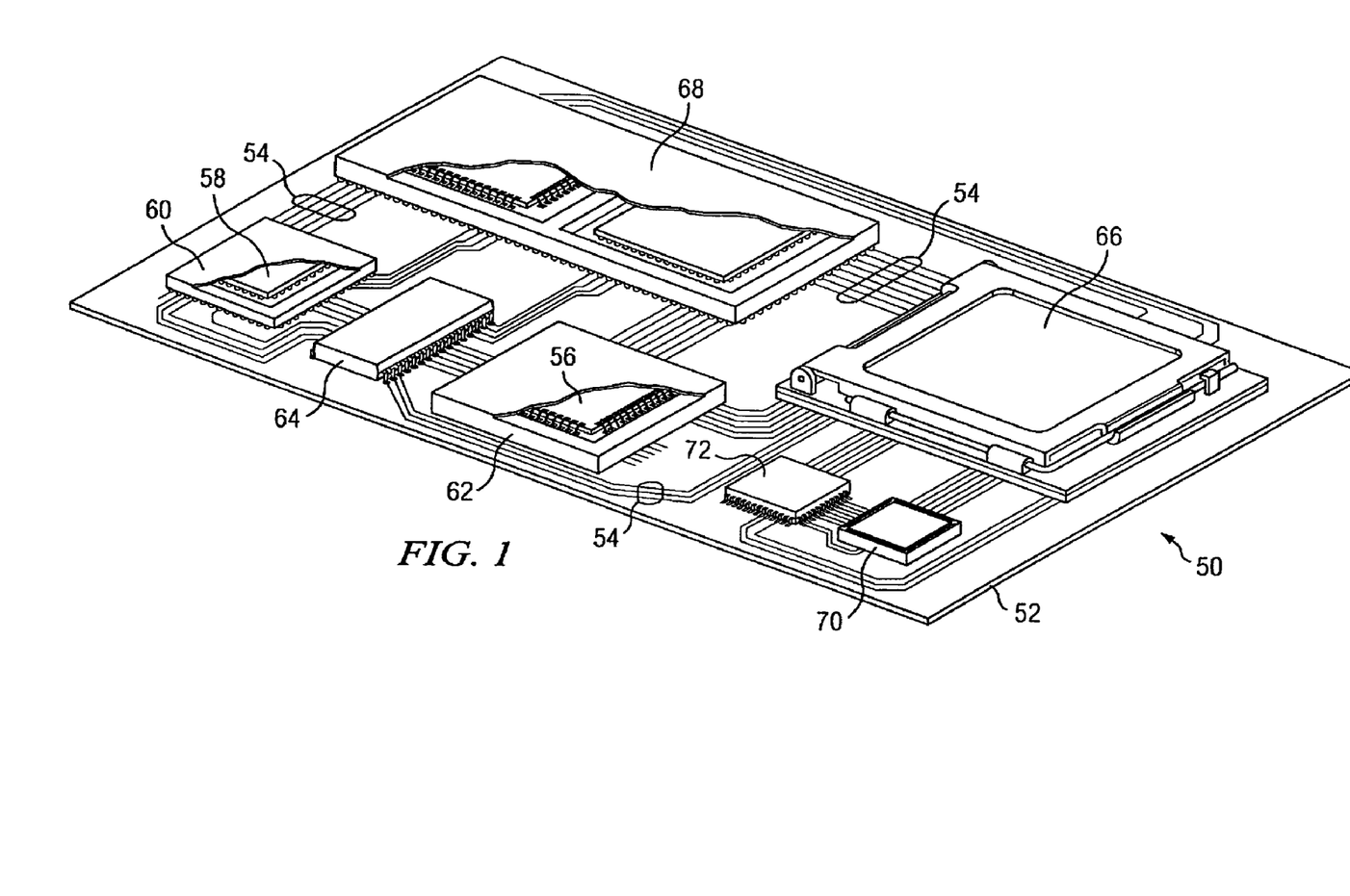
FIG. 1 illustrates a PCB with different types of packages mounted to its surface.

FIG. 1 illustrates electronic device 50 having a chip carrier substrate or PCB 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
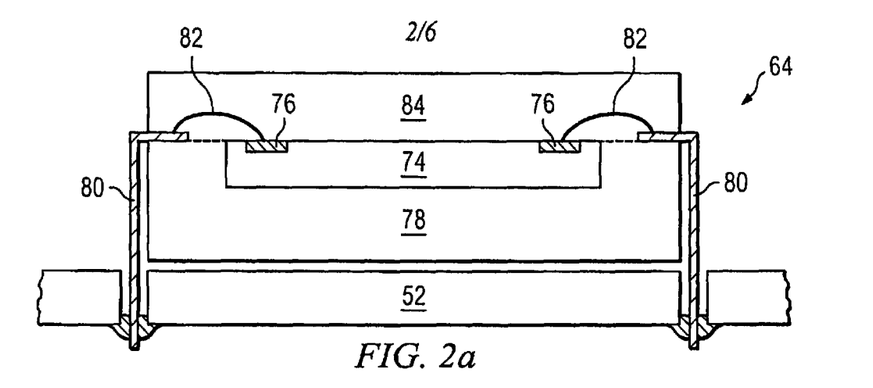
FIGS. 2a-2c illustrate further detail of the representative semiconductor packages mounted to the PCB.
Figure 2B:
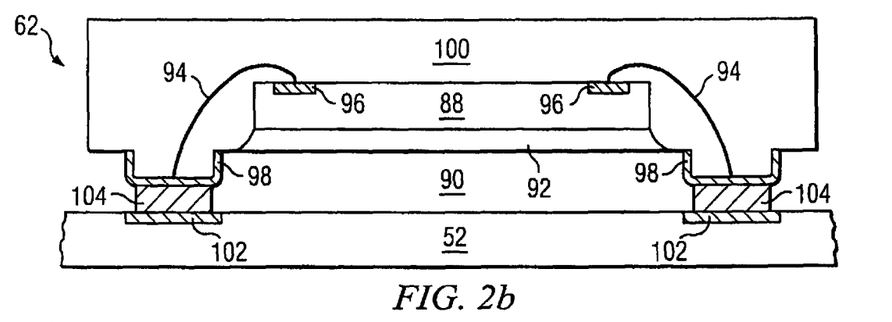
Figure 2C:
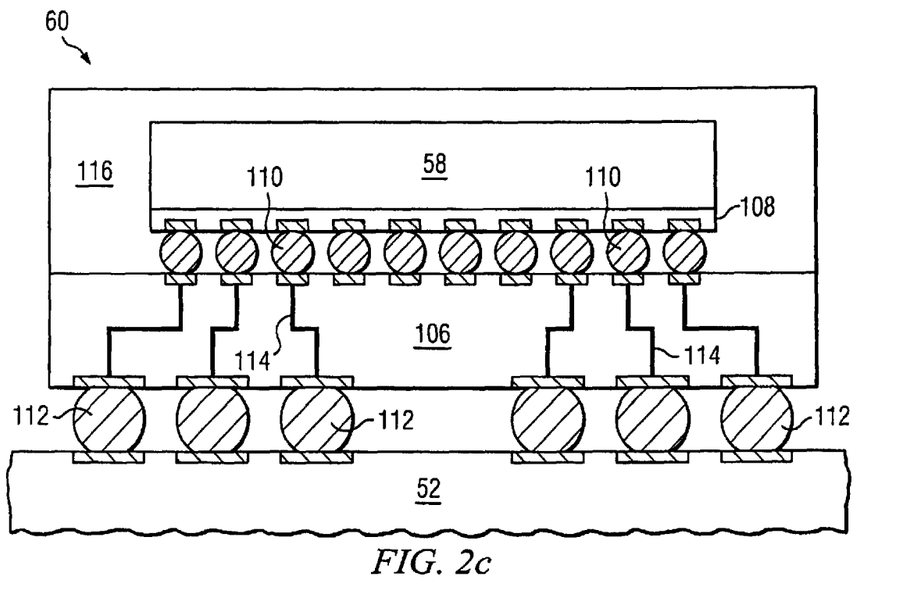

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition such as electrolytic plating or electroless plating to prevent oxidation. Contact pads 102 are electrically connected to one or more conductive signal traces 54 in PCB 52. Solder material is deposited between contact pads 98 of BCC 62 and contact pads 102 of PCB 52 and reflowed to form bumps 104 which form a mechanical and electrical connection between BCC 62 and PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through solder bumps or balls 110.

BGA 60 is electrically and mechanically connected to PCB 52 with a BGA style second level packaging using solder bumps or balls 112. Semiconductor die 58 is electrically connected to conductive signal traces 54 in PCB 52 through solder bumps 110, signal lines 114, and solder bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
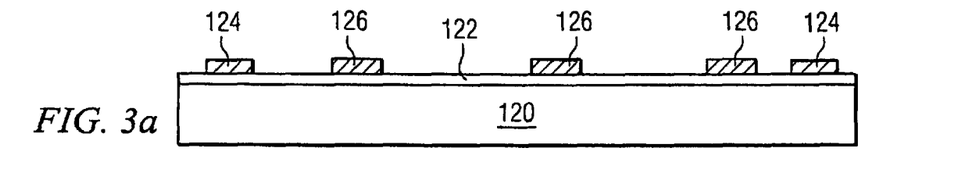
FIGS. 3a-3h illustrate a process of forming a vertical interconnect structure using conductive pillars and UBM fixed relative to the conductive pillars for alignment of the semiconductor die.

FIGS. 3a-3h illustrate a process of forming a vertical interconnect structure with conductive pillars and UBM fixed relative to the conductive pillars for alignment of the semiconductor die. In FIG. 3a, a sacrificial or temporary substrate or carrier 120 contains a base material such as silicon, polymer, polymer composite, metal foil, ceramic, glass, glass epoxy, beryllium oxide, tape, or other suitable low-cost, rigid material for structural support. An optional seed layer 122 can be formed over carrier 120 for subsequent plating. An electrically conductive layer 124 is formed over carrier 120 using patterning with PVD, CVD, sputtering, electrolytic plating, electroless plating process, or other suitable metal deposition process. Conductive layer 124 can be one or more layers of Al, Cu, Sn, Ni, Au, Ag, W, poly-silicon, or other suitable electrically conductive material. Conductive layer 124 includes wettable contact pads for later formation of conductive pillars. In one embodiment, the wettable contact pads of conductive layer 124 are pre-plated over carrier 120.

An electrically conductive layer 126 is formed over seed layer 122 using patterning with PVD, CVD, sputtering, electrolytic plating, electroless plating process, or other suitable metal deposition process. Conductive layer 126 can be one or more layers of Al, Cu, Sn, Ni, Au, Ag, or other suitable electrically conductive material. Conductive layer 126 is coplanar with conductive layer 124. Conductive layer 126 is a UBM layer fixed in position with respect to conductive layer 124. UBM 126 can be a multi-metal stack with adhesion layer, barrier layer, and seed or wetting layer. The adhesion layer can be Ti, titanium nitride (TiN), titanium tungsten (TiW), Al, or chromium (Cr). The barrier layer is formed over the adhesion layer and can be made of Ni, nickel vanadium (NiV), platinum (Pt), palladium (Pd), TiW, or chromium copper (CrCu). The barrier layer inhibits the diffusion of Cu into the active area of the die. The seed layer can be Cu, Ni, NiV, Au, or Al. The seed layer is formed over the barrier layer. UBM 126 provides a low resistive interconnect, as well as a barrier to solder diffusion and seed layer for solder wettability.

Figure 3B:
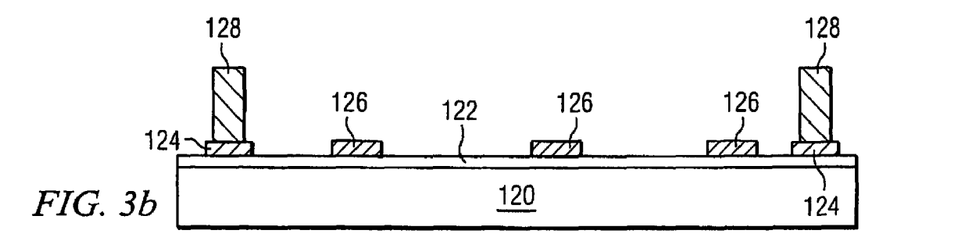

In FIG. 3b, a plurality of conductive pillars or posts 128 are formed over the wettable contact pads of conductive layer 124. In one embodiment, conductive pillars 128 are formed by depositing one or more layers of photoresist over seed layer 122 or carrier 120. The portion of photoresist over conductive layer 124 is exposed and removed by an etch development process. Conductive material is deposited in the removed portion of the photoresist layer using a selective plating process. The photoresist layer is stripped away leaving behind individual conductive pillars 128. Conductive pillars 128 can be Cu, Al, tungsten (W), Au, solder, or other suitable electrically conductive material. Conductive pillars 128 have a height ranging from 2-120 micrometers (μm). In another embodiment, conductive pillars 128 can be formed as stud bumps or stacked bumps. In any case, conductive pillars 128 have a rigid and secure metal-to-metal bonding to UBM 126 by solder or intermetallic compound (IMC) containing Cu, Ag, Bi, or Sn.

Figure 3C:
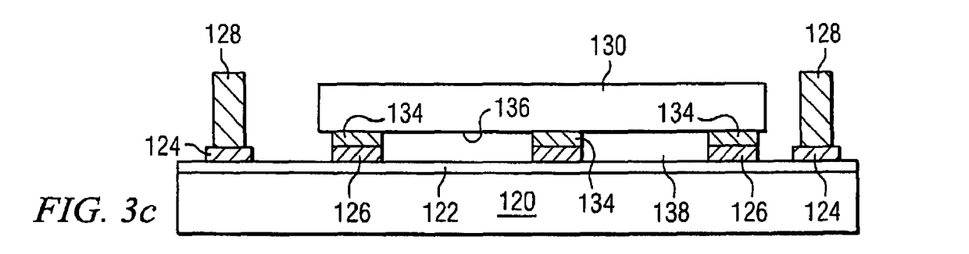

In FIG. 3c, a plurality of semiconductor die or components 130 is mounted to UBM 126 in a flipchip arrangement with metal bumps 134 oriented downward over carrier 120. Semiconductor die 130 includes an active surface 136 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 136 to implement baseband analog circuits or digital circuits, such as digital signal processor (DSP), ASIC, memory, or other signal processing circuit. Semiconductor die 130 may also contain IPD, such as inductors, capacitors, and resistors, for RF signal processing. In another embodiment, a discrete semiconductor component can be mounted to carrier 120.

UBM 126 are fixed in position relative to conductive layer 124. Conductive pillars 128 are mounted on conductive layer 124 around semiconductor die 130. Accordingly, UBM 126 is fixed in position relative to conductive pillars 128. By mating metal bumps 134 to UBM 126, semiconductor die 130 is self-aligned with respect to conductive pillars 128.

Figure 3D:
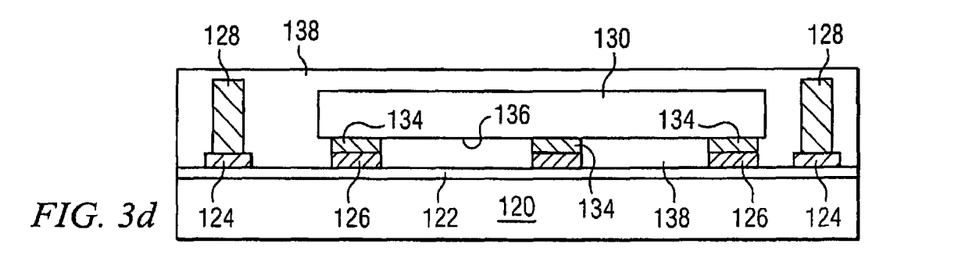

FIG. 3d shows an encapsulant or molding compound 138 deposited over semiconductor die 130 and conductive pillars 128 using a paste printing, compressive molding, transfer molding, liquid encapsulant molding, vacuum lamination, or other suitable applicator. Encapsulant 138 can be polymer composite material, such as epoxy resin with filler, epoxy acrylate with filler, or polymer with proper filler. Encapsulant 138 is non-conductive and environmentally protects the semiconductor device from external elements and contaminants. With metal bumps 134 of semiconductor die 130 securely mounted to fixed UBM 126, the die does not shift in alignment with respect to conductive pillars 128 during the encapsulation process.

Figure 3E:
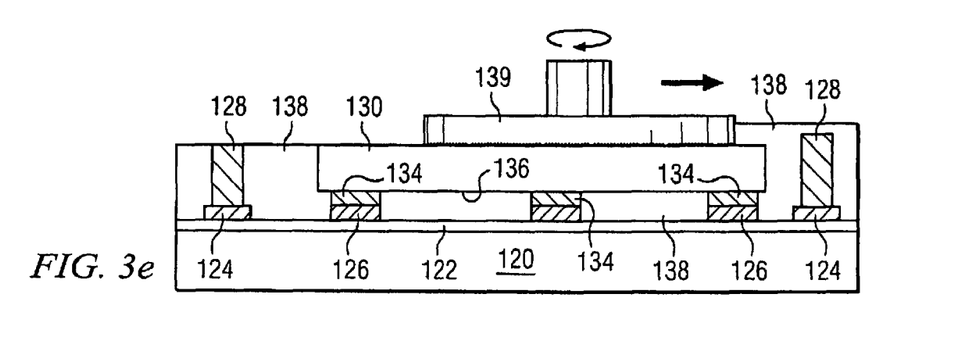

In FIG. 3e, encapsulant 138 undergoes grinding or plasma etching to planarize the surface for formation of a topside build-up interconnect structure. In one embodiment, grinder 139 exposes the top surface of conductive pillars 128 and a back surface of semiconductor die 130. Alternatively, grinder 139 exposes the top surface of conductive pillars 128, and leaves semiconductor die 130 embedded within encapsulant 138.

Figure 3F:
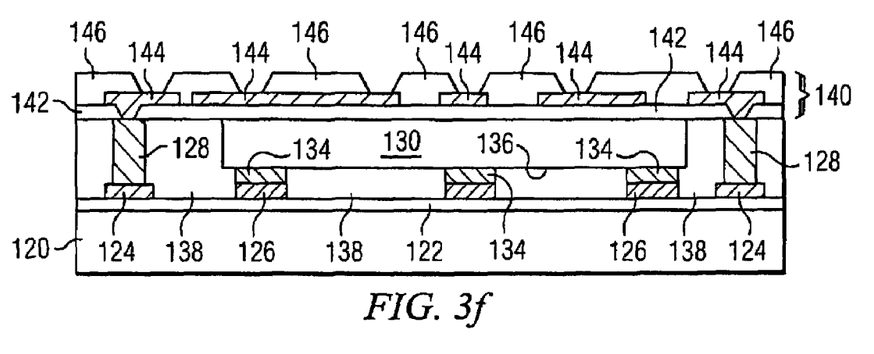

In FIG. 3f, a topside build-up interconnect structure 140 is formed over conductive pillars 128, first surface of encapsulant 138, and back surface of semiconductor die 130. An insulating or passivation layer 142 is formed using PVD, CVD, printing, spin coating, spray coating, sintering, or thermal oxidation. The passivation layer 142 can be one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of passivation layer 142 is removed by an etching process to expose conductive pillars 128.

An electrically conductive layer 144 is formed over passivation layer 142 and conductive pillars 128 using patterning with PVD, CVD, sputtering, electrolytic plating, electroless plating process, or other suitable metal deposition process. Conductive layer 144 can be one or more layers of Al, Cu, Sn, Ni, Au, Ag, or other suitable electrically conductive material. A portion of conductive layer 144 is electrically connected to conductive pillars 128. Other portions of conductive layer 144 can be electrically common or electrically isolated depending on the design and function of the semiconductor device.

An insulating or passivation layer 146 is formed over passivation layer 142 and conductive layer 144 using PVD, CVD, printing, spin coating, spray coating, sintering, or thermal oxidation. The passivation layer 146 can be one or more layers of SiO2, Si3N4, SiON, Ta2O5, Al2O3, or other material having similar insulating and structural properties. A portion of passivation layer 146 is removed by an etching process to expose conductive layer 144.

Figure 3G:
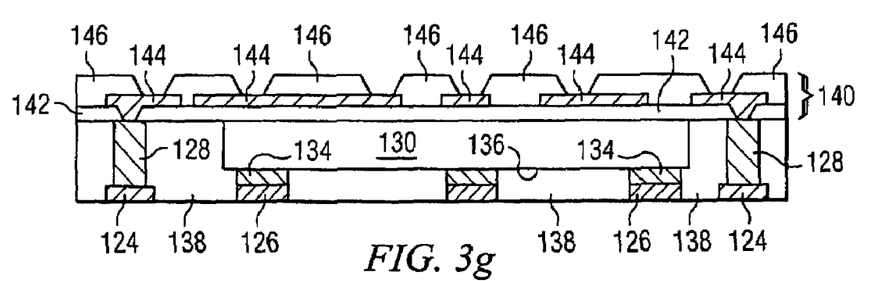

In FIG. 3g, carrier 120 is removed by chemical wet etching, plasma dry etching, mechanical peel-off, CMP, mechanical grinding, thermal bake, laser scanning, or wet stripping. Encapsulant 138 provides structural support for semiconductor die 130 after removal of carrier 120. Conductive layer 124 and UBM 126 are exposed following removal of carrier 120.

Figure 3H:
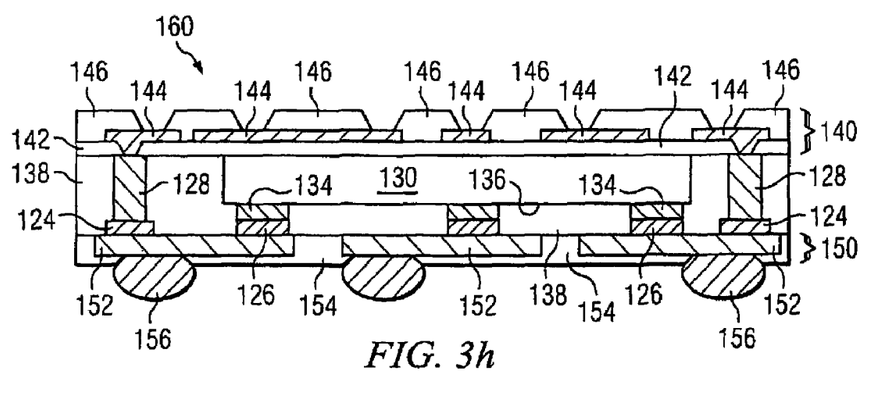

In FIG. 3h, a bottom-side build-up interconnect structure 150 is formed over conductive pillars 128 and second surface of encapsulant 138, opposite topside build-up interconnect structure 140. An electrically conductive layer 152 is formed over conductive layer 124 and UBM 126 using patterning with PVD, CVD, sputtering, electrolytic plating, electroless plating process, or other suitable metal deposition process. Conductive layer 152 can be one or more layers of Al, Cu, Sn, Ni, Au, Ag, or other suitable electrically conductive material. Portions of conductive layer 152 are electrically connected to conductive pillars 128, conductive layer 124, and UBM 126. Other portions of conductive layer 152 can be electrically common or electrically isolated depending on the design and function of the semiconductor device.

An insulating or passivation layer 154 is formed over conductive layer 152 and the second surface of encapsulant 138 using PVD, CVD, printing, spin coating, spray coating, sintering, or thermal oxidation. The passivation layer 154 can be one or more layers of SiO2, Si3N4, SiON, Ta2O5, Al2O3, or other material having similar insulating and structural properties. A portion of passivation layer 154 is removed by an etching process to expose conductive layer 152.

An electrically conductive bump material is deposited over conductive layer 152 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 152 using a suitable attachment or bonding process. In one embodiment, the bump material is reflowed by heating the material above its melting point to form spherical balls or bumps 156. In some applications, bumps 156 are reflowed a second time to improve electrical contact to conductive layer 152. The bumps can also be compression bonded to conductive layer 152. Bumps 156 represent one type of interconnect structure that can be formed over conductive layer 152. The interconnect structure can also use bond wires, conductive paste, stud bump, micro bump, or other electrical interconnect.

Figure 4:
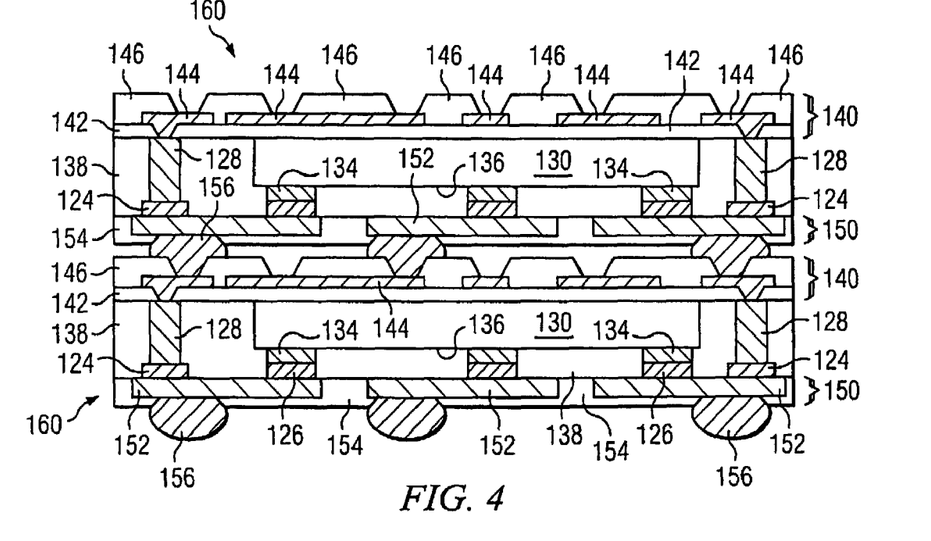
FIG. 4 illustrates stacked semiconductor devices electrically interconnected with the conductive pillars.

Semiconductor die 130 are singulated with saw blade or laser cutting tool into individual semiconductor devices 160. After singulation, the individual semiconductor devices 160 can be stacked, as shown in FIG. 4. Conductive pillars 128 provide vertical, z-direction interconnect between topside build-up interconnect layer 140 and bottom-side build-up interconnect layer 150. Conductive layer 144 is electrically connected through conductive pillars 128 to conductive layer 152 and metal bumps 134 of each semiconductor device 160.

Figure 5:
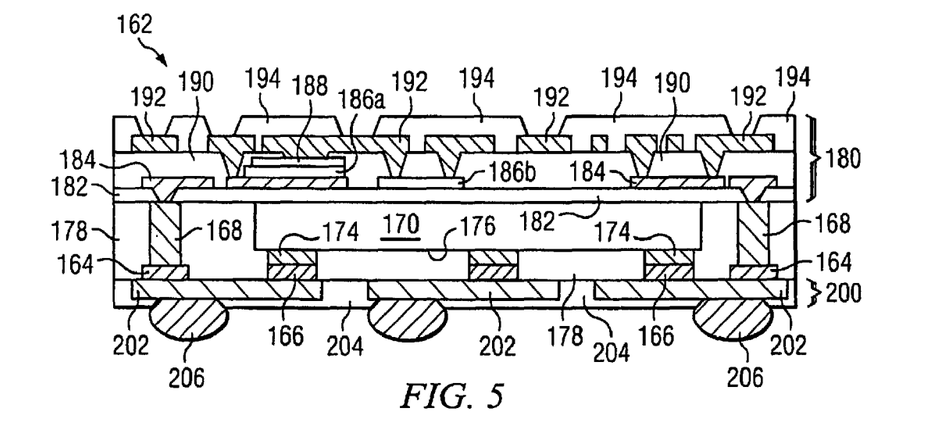
FIG. 5 illustrates the semiconductor device with IPD formed in a topside interconnect structure.

FIG. 5 illustrates an embodiment of the vertical interconnect structure with multiple IPD formed in the topside interconnect structure. Similar to the process described in FIGS. 3a-3h, semiconductor device 162 uses a sacrificial or temporary substrate or carrier with an optional seed layer. An electrically conductive layer 164 is formed over the carrier using patterning with PVD, CVD, sputtering, electrolytic plating, electroless plating process, or other suitable metal deposition process. Conductive layer 164 can be one or more layers of Al, Cu, Sn, Ni, Au, Ag, W, poly-silicon, or other suitable electrically conductive material. Conductive layer 164 includes wettable contact pads for later formation of conductive pillars.

An electrically conductive layer 166 is formed over the seed layer or carrier using patterning with PVD, CVD, sputtering, electrolytic plating, electroless plating process, or other suitable metal deposition process. Conductive layer 166 can be one or more layers of Al, Cu, Sn, Ni, Au, Ag, or other suitable electrically conductive material. Conductive layer 166 is coplanar with conductive layer 164. Conductive layer 166 is a UBM layer fixed in position with respect to conductive layer 164.

A plurality of conductive pillars or posts 168 is formed over the wettable contact pads of conductive layer 164. In one embodiment, conductive pillars 168 are formed by depositing one or more layers of photoresist over the seed layer or carrier. The portion of photoresist over conductive layer 164 is exposed and removed by an etch development process. Conductive material is deposited in the removed portion of the photoresist layer using a selective plating process. The photoresist layer is stripped away leaving behind individual conductive pillars 168. Conductive pillars 168 can be Cu, Al, W, Au, solder, or other suitable electrically conductive material. Conductive pillars 168 have a height ranging from 2-120 μm. In another embodiment, conductive pillars 168 can be formed as stud bumps or stacked bumps. In any case, conductive pillars 168 have a rigid and secure metal-to-metal bonding to UBM 166 by solder or IMC containing Cu, Ag, Bi, or Sn.

A plurality of semiconductor die or components 170 is mounted to UBM 166 in a flipchip arrangement with metal bumps 174 oriented downward over the carrier. Semiconductor die 170 includes an active surface 176 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 176 to implement baseband analog circuits or digital circuits, such as DSP, ASIC, memory, or other signal processing circuit. Semiconductor die 170 may also contain IPD, such as inductors, capacitors, and resistors, for RF signal processing.

UBM 166 are fixed in position relative to conductive layer 164. Conductive pillars 168 are mounted on conductive layer 164 around semiconductor die 170. Accordingly, UBM 166 is fixed in position relative to conductive pillars 168. By mating metal bumps 174 to UBM 166, semiconductor die 170 is self-aligned with respect to conductive pillars 168.

An encapsulant or molding compound 178 is deposited over semiconductor die 170 and conductive pillars 168 using a paste printing, compressive molding, transfer molding, liquid encapsulant molding, vacuum lamination, or other suitable applicator. Encapsulant 178 can be polymer composite material, such as epoxy resin with filler, epoxy acrylate with filler, or polymer with proper filler. Encapsulant 178 is non-conductive and environmentally protects the semiconductor device from external elements and contaminants. With metal bumps 174 of semiconductor die 170 securely mounted to fixed UBM 166, the die does not shift in alignment with respect to conductive pillars 168 during the encapsulation process.

The encapsulant 178 undergoes grinding or plasma etching to planarize the surface for formation of a topside build-up interconnect structure. The grinding operation exposes the top surface of conductive pillars 168 and a back surface of semiconductor die 170. The topside build-up interconnect structure 180 is formed over conductive pillars 168, first surface of encapsulant 178, and back surface of semiconductor die 170. An insulating or passivation layer 182 is formed using PVD, CVD, printing, spin coating, spray coating, sintering, or thermal oxidation. The passivation layer 182 can be one or more layers of SiO2, Si3N4, SiON, Ta2O5, Al2O3, or other material having similar insulating and structural properties. A portion of passivation layer 182 is removed by an etching process to expose conductive pillars 168.

An electrically conductive layer 184 is formed over passivation layer 182 and conductive pillars 168 using patterning with PVD, CVD, sputtering, electrolytic plating, electroless plating process, or other suitable metal deposition process. Conductive layer 184 can be one or more layers of Al, Cu, Sn, Ni, Au, Ag, or other suitable electrically conductive material. A portion of conductive layer 184 is electrically connected to conductive pillars 168. Other portions of conductive layer 184 can be electrically common or electrically isolated depending on the design and function of the semiconductor device.

A resistive layer 186a-186b is patterned and deposited over conductive layer 184 and insulating layer 182, respectively, using PVD or CVD. Resistive layer 186 is tantalum silicide (TaxSiy) or other metal silicides, TaN, nickel chromium (NiCr), TiN, or doped poly-silicon having a resistivity between 5 and 100 ohm/sq. An insulating layer 188 is formed over resistive layer 186a using PVD, CVD, printing, sintering, or thermal oxidation. The insulating layer 188 can be one or more layers of Si3N4, SiO2, SiON, Ta2O5, ZnO, ZrO2, Al2O3, polyimide, BCB, PBO, or other suitable dielectric material. Resistive layer 186 and insulating layer 188 can be formed with the same mask and etched at the same time. Alternatively, resistive layer 186 and insulating layer 188 can be patterned and etched with a different mask.

An insulating or passivation layer 190 is formed over passivation layer 182, conductive layer 184, resistive layer 186, and insulating layer 188 using spin coating, PVD, CVD, printing, sintering, or thermal oxidation. The passivation layer 190 can be one or more layers of SiO2, Si3N4, SiON, Ta2O5, Al2O3, or other material having suitable insulating properties. A portion of passivation layer 190 is removed to expose conductive layer 184, resistive layer 186, and insulating layer 188.

An electrically conductive layer 192 is patterned and deposited over passivation layer 190, conductive layer 184, resistive layer 186, and insulating layer 188 using PVD, CVD, sputtering, electrolytic plating, electroless plating process, or other suitable metal deposition process to form individual portions or sections for further interconnectivity. The individual portions of conductive layer 192 can be electrically common or electrically isolated depending on the connectivity of the individual semiconductor die. Conductive layer 192 can be one or more layers of Al, Cu, Sn, Ni, Au, Ag, or other suitable electrically conductive material.

An insulating or passivation layer 194 is formed over conductive layers 192 and passivation layer 190 using spin coating, PVD, CVD, printing, sintering, or thermal oxidation. The passivation layer 194 can be one or more layers of SiO2, Si3N4, SiON, Ta2O5, Al2O3, or other material having suitable insulating properties. A portion of passivation layer 194 is removed to expose conductive layer 192.

The structures described in build-up interconnect structure 180 constitute one or more passive circuit elements or IPDs. In one embodiment, conductive layer 184, resistive layer 186a, insulating layer 188, and conductive layer 192 is a metal-insulator-metal (MIM) capacitor. Resistive layer 186b is a resistor element in the passive circuit. The individual sections of conductive layer 192 can be wound or coiled in plan-view to produce or exhibit the desired properties of an inductor.

The IPD structure provides electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The inductor can be a hi-Q balun, transformer, or coil, operating up to 100 Gigahertz. In some applications, multiple baluns are formed over a same substrate, allowing multi-band operation. For example, two or more baluns are used in a quad-band for mobile phones or other global system for mobile (GSM) communications, each balun dedicated for a frequency band of operation of the quad-band device. A typical RF system requires multiple IPDs and other high frequency circuits in one or more semiconductor packages to perform the necessary electrical functions.

The carrier is removed by chemical wet etching, plasma dry etching, mechanical peel-off, CMP, mechanical grinding, thermal bake, laser scanning, or wet stripping. Encapsulant 178 provides structural support for semiconductor die 170 after removal of the carrier. Conductive layer 164 and UBM 166 are exposed following removal of the carrier.

A bottom-side build-up interconnect structure 200 is formed over conductive pillars 168 and second surface of encapsulant 178, opposite topside build-up interconnect structure 180. An electrically conductive layer 202 is formed over conductive layer 164 and UBM 166 using patterning with PVD, CVD, sputtering, electrolytic plating, electroless plating process, or other suitable metal deposition process. Conductive layer 202 can be one or more layers of Al, Cu, Sn, Ni, Au, Ag, or other suitable electrically conductive material. Portions of conductive layer 202 are electrically connected to conductive pillars 168, conductive layer 164, and UBM 166. Other portions of conductive layer 202 can be electrically common or electrically isolated depending on the design and function of the semiconductor device.

An insulating or passivation layer 204 is formed over conductive layer 202 and the second surface of encapsulant 178 using PVD, CVD, printing, spin coating, spray coating, sintering, or thermal oxidation. The passivation layer 204 can be one or more layers of SiO2, Si3N4, SiON, Ta2O5, Al2O3, or other material having similar insulating and structural properties. A portion of passivation layer 204 is removed by an etching process to expose conductive layer 202.

An electrically conductive bump material is deposited over conductive layer 202 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 202 using a suitable attachment or bonding process. In one embodiment, the bump material is reflowed by heating the material above its melting point to form spherical balls or bumps 206. In some applications, bumps 206 are reflowed a second time to improve electrical contact to conductive layer 202. The bumps can also be compression bonded to conductive layer 202. Bumps 206 represent one type of interconnect structure that can be formed over conductive layer 202. The interconnect structure can also use bond wires, conductive paste, stud bump, micro bump, or other electrical interconnect.

Conductive pillars 168 provide vertical, z-direction interconnect between topside build-up interconnect layer 180 and bottom-side build-up interconnect layer 200. Conductive layer 184 is electrically connected through conductive pillars 168 to conductive layer 202 and metal bumps 174 of semiconductor die 170.

Figure 6:
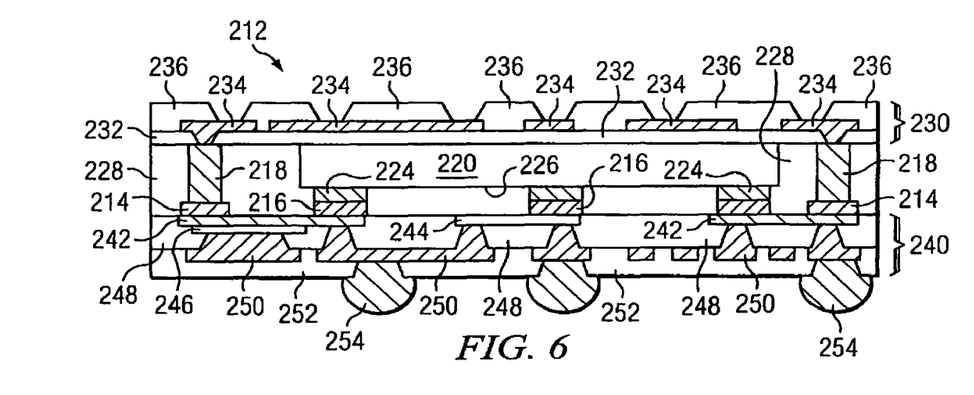
FIG. 6 illustrates the semiconductor device with IPD formed in a bottom-side interconnect structure.

FIG. 6 illustrates an embodiment of the vertical interconnect structure with multiple IPD formed in bottom-side interconnect structure. Similar to the process described in FIGS. 3a-3h, semiconductor device 212 uses a sacrificial or temporary substrate or carrier with an optional seed layer. An electrically conductive layer 214 is formed over the carrier using patterning with PVD, CVD, sputtering, electrolytic plating, electroless plating process, or other suitable metal deposition process. Conductive layer 214 can be one or more layers of Al, Cu, Sn, Ni, Au, Ag, W, poly-silicon, or other suitable electrically conductive material. Conductive layer 214 includes wettable contact pads for later formation of conductive pillars.

An electrically conductive layer 216 is formed over the seed layer or carrier using patterning with PVD, CVD, sputtering, electrolytic plating, electroless plating process, or other suitable metal deposition process. Conductive layer 216 can be one or more layers of Al, Cu, Sn, Ni, Au, Ag, or other suitable electrically conductive material. Conductive layer 216 is coplanar with conductive layer 214. Conductive layer 216 is a UBM layer fixed in position with respect to conductive layer 214.

A plurality of conductive pillars or posts 218 are formed over the wettable contact pads of conductive layer 214. In one embodiment, conductive pillars 218 are formed by depositing one or more layers of photoresist over the seed layer or carrier. The portion of photoresist over conductive layer 214 is exposed and removed by an etch development process. Conductive material is deposited in the removed portion of the photoresist layer using a selective plating process. The photoresist layer is stripped away leaving behind individual conductive pillars 218. Conductive pillars 218 can be Cu, Al, W, Au, solder, or other suitable electrically conductive material. Conductive pillars 218 have a height ranging from 2-120 μm. In another embodiment, conductive pillars 218 can be formed as stud bumps or stacked bumps. In any case, conductive pillars 168 have a rigid and secure metal-to-metal bonding to UBM 216 by solder or IMC containing Cu, Ag, Bi, or Sn.

A plurality of semiconductor die or components 220 is mounted to UBM 216 in a flipchip arrangement with metal bumps 224 oriented downward over the carrier. Semiconductor die 220 includes an active surface 226 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 226 to implement baseband analog circuits or digital circuits, such as DSP, ASIC, memory, or other signal processing circuit. Semiconductor die 220 may also contain IPD, such as inductors, capacitors, and resistors, for RF signal processing.

UBMs 216 are fixed in position relative to conductive layer 214. Conductive pillars 218 are mounted on conductive layer 214 around semiconductor die 220. Accordingly, UBM 216 is fixed in position relative to conductive pillars 218. By mating metal bumps 224 to UBM 216, semiconductor die 220 is self-aligned with respect to conductive pillars 218.

An encapsulant or molding compound 228 is deposited over semiconductor die 220 and conductive pillars 218 using a paste printing, compressive molding, transfer molding, liquid encapsulant molding, vacuum lamination, or other suitable applicator. Encapsulant 228 can be polymer composite material, such as epoxy resin with filler, epoxy acrylate with filler, or polymer with proper filler. Encapsulant 228 is non-conductive and environmentally protects the semiconductor device from external elements and contaminants. With metal bumps 224 of semiconductor die 220 securely mounted to fixed UBM 216, the die does not shift in alignment with respect to conductive pillars 218 during the encapsulation process.

The encapsulant 228 undergoes grinding or plasma etching to planarize the surface for formation of a topside build-up interconnect structure. The grinding operation exposes the top surface of conductive pillars 218 and a back surface of semiconductor die 220. The topside build-up interconnect structure 230 is formed over conductive pillars 218, first surface of encapsulant 228, and back surface of semiconductor die 220. An insulating or passivation layer 232 is formed using PVD, CVD, printing, spin coating, spray coating, sintering, or thermal oxidation. The passivation layer 232 can be one or more layers of $SiO_2$, $Si_3N_4$, $SiON$, $Ta_2O_5$, $Al_2O_3$, or other material having similar insulating and structural properties. A portion of passivation layer 232 is removed by an etching process to expose conductive pillars 218.

An electrically conductive layer 234 is formed over passivation layer 232 and conductive pillars 218 using patterning with PVD, CVD, sputtering, electrolytic plating, electroless plating process, or other suitable metal deposition process. Conductive layer 234 can be one or more layers of Al, Cu, Sn, Ni, Au, Ag, or other suitable electrically conductive material. A portion of conductive layer 234 is electrically connected to conductive pillars 218. Other portions of conductive layer 234 can be electrically common or electrically isolated depending on the design and function of the semiconductor device.

An insulating or passivation layer 236 is formed over insulating layer 232 and conductive layer 234 using PVD, CVD, printing, spin coating, spray coating, sintering, or thermal oxidation. The passivation layer 236 can be one or more layers of $SiO_2$, $Si_3N_4$, $SiON$, $Ta_2O_5$, $Al_2O_3$, or other material having similar insulating and structural properties. A portion of passivation layer 236 is removed by an etching process to expose conductive layer 234.

The carrier is removed by chemical wet etching, plasma dry etching, mechanical peel-off, CMP, mechanical grinding, thermal bake, laser scanning, or wet stripping. Encapsulant 228 provides structural support for semiconductor die 220 after removal of the carrier. Conductive layer 214 and UBM 216 are exposed following removal of the carrier.

A bottom-side build-up interconnect structure 240 is formed over conductive pillars 218 and second surface of encapsulant 228, opposite topside build-up interconnect structure 230. An electrically conductive layer 242 is formed over conductive layer 214 and UBM 216 using patterning with PVD, CVD, sputtering, electrolytic plating, electroless plating process, or other suitable metal deposition process. Conductive layer 242 can be one or more layers of Al, Cu, Sn, Ni, Au, Ag, or other suitable electrically conductive material.

Portions of conductive layer 242 are electrically connected to conductive pillars 218, conductive layer 214, and UBM 216. Other portions of conductive layer 242 can be electrically common or electrically isolated depending on the design and function of the semiconductor device.

A resistive layer 244 is patterned and deposited using PVD or CVD. Resistive layer 244 is TaxSiy or other metal silicides, TaN, NiCr, TiN, or doped poly-silicon having a resistivity between 5 and 100 ohm/sq. An insulating layer 246 is formed over conductive layer 242 using PVD, CVD, printing, sintering, or thermal oxidation. The insulating layer 246 can be one or more layers of Si3N4, SiO2, SiON, Ta2O5, ZnO, ZrO2, Al2O3, polyimide, BCB, PBO, or other suitable dielectric material. Resistive layer 244 and insulating layer 246 can be formed with the same mask and etched at the same time. Alternatively, resistive layer 244 and insulating layer 246 can be patterned and etched with a different mask.

An insulating or passivation layer 248 is formed over conductive layer 242, resistive layer 244, and insulating layer 246 using spin coating, PVD, CVD, printing, sintering, or thermal oxidation. The passivation layer 248 can be one or more layers of SiO2, Si3N4, SiON, Ta2O5, Al2O3, or other material having suitable insulating properties. A portion of passivation layer 248 is removed to expose conductive layer 242, resistive layer 244, and insulating layer 246.

An electrically conductive layer 250 is patterned and deposited over passivation layer 248, conductive layer 242, resistive layer 244, and insulating layer 246 using PVD, CVD, sputtering, electrolytic plating, electroless plating process, or other suitable metal deposition process to form individual portions or sections for further interconnectivity. The individual portions of conductive layer 250 can be electrically common or electrically isolated depending on the connectivity of the individual semiconductor die. Conductive layer 250 can be one or more layers of Al, Cu, Sn, Ni, Au, Ag, or other suitable electrically conductive material.

An insulating or passivation layer 252 is formed over conductive layer 250 and passivation layer 248 using spin coating, PVD, CVD, printing, sintering, or thermal oxidation. The passivation layer 252 can be one or more layers of SiO2, Si3N4, SiON, Ta2O5, Al2O3, or other material having suitable insulating properties. A portion of passivation layer 252 is removed to expose conductive layer 250.

The structures described in build-up interconnect structure 240 constitute one or more passive circuit elements or IPDs. In one embodiment, conductive layer 242, insulating layer 246, and conductive layer 250 is a MIM capacitor. Resistive layer 244 is a resistor element in the passive circuit. The individual sections of conductive layer 250 can be wound or coiled in plan-view to produce or exhibit the desired properties of an inductor.

An electrically conductive bump material is deposited over conductive layer 250 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 250 using a suitable attachment or bonding process. In one embodiment, the bump material is reflowed by heating the material above its melting point to form spherical balls or bumps 254. In some applications, bumps 254 are reflowed a second time to improve electrical contact to conductive layer 250. The bumps can also be compression bonded to conductive layer 250. Bumps 254 represent one type of interconnect structure that can be formed over conductive layer 250. The interconnect structure can also use bond wires, conductive paste, stud bump, micro bump, or other electrical interconnect.

Conductive pillars 218 provide vertical, z-direction interconnect between topside build-up interconnect layer 230 and bottom-side build-up interconnect layer 240. Conductive layer 234 is electrically connected through conductive pillars 218 to conductive layers 242 and 250 and metal bumps 224 of semiconductor die 220.

Figure 7:
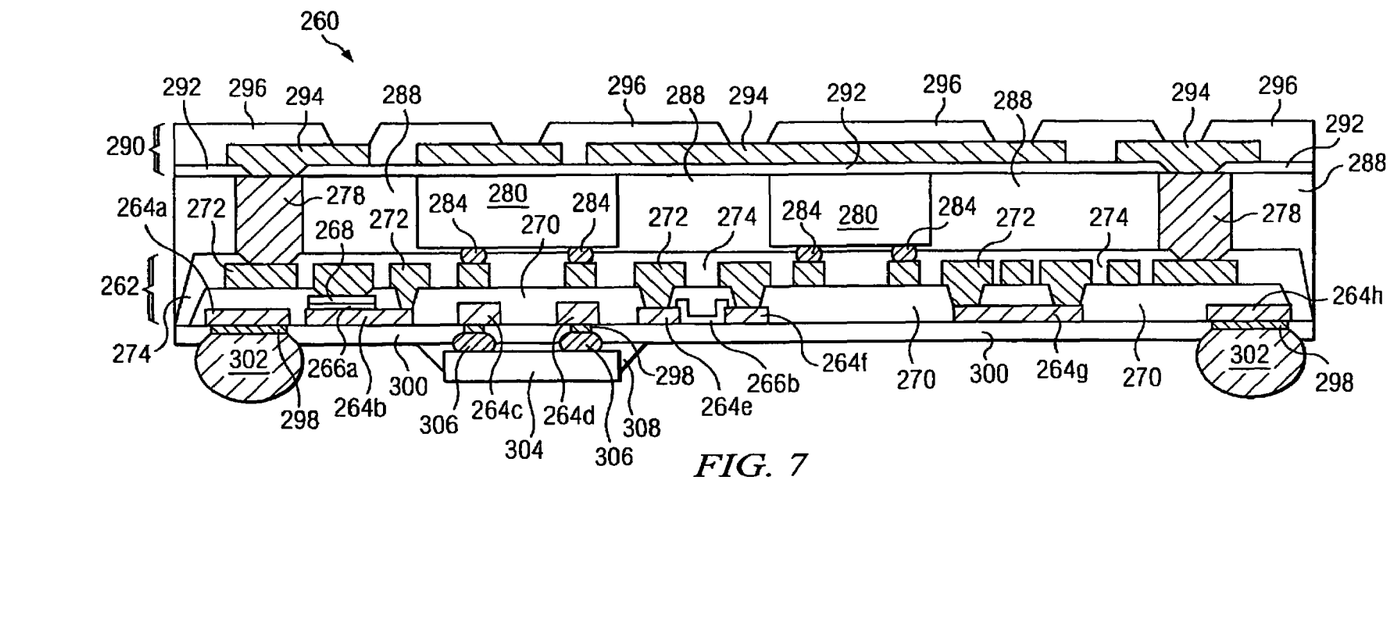
FIG. 7 illustrates another embodiment of the semiconductor device with IPD formed in a bottom-side interconnect structure.

FIG. 7 illustrates an embodiment of the vertical interconnect structure with multiple IPD formed in the bottom-side build-up interconnect structure. Semiconductor device 260 uses a sacrificial or temporary substrate or carrier. A bottom-side build-up interconnect structure 262 is formed over the carrier. An electrically conductive layer 264 is formed using patterning with PVD, CVD, sputtering, electrolytic plating, electroless plating process, or other suitable metal deposition process to form individual portions or sections 264a-264h. Conductive layer 264 can be one or more layers of Al, Cu, Sn, Ni, Au, Ag, or other suitable electrically conductive material. The portions of conductive layer 264 can be electrically common or electrically isolated depending on the design and function of the semiconductor device.

A resistive layer 266a-266b is patterned and deposited over conductive layer 264 and the carrier, respectively, using PVD or CVD. Resistive layer 266 is TaxSiy or other metal silicides, TaN, NiCr, TiN, or doped poly-silicon having a resistivity between 5 and 100 ohm/sq. An insulating layer 268 is formed over resistive layer 266a using PVD, CVD, printing, sintering, or thermal oxidation. The insulating layer 268 can be one or more layers of Si3N4, SiO2, SiON, Ta2O5, ZnO, ZrO2, Al2O3, polyimide, BCB, PBO, or other suitable dielectric material.

An insulating or passivation layer 270 is formed over conductive layer 264, resistive layer 266, and insulating layer 268 using spin coating, PVD, CVD, printing, sintering, or thermal oxidation. The passivation layer 270 can be one or more layers of SiO2, Si3N4, SiON, Ta2O5, Al2O3, or other material having suitable insulating properties. A portion of passivation layer 270 is removed to expose conductive layer 264, resistive layer 266, and insulating layer 268.

An electrically conductive layer 272 is patterned and deposited over passivation layer 270, conductive layer 264, resistive layer 266, and insulating layer 268 using PVD, CVD, sputtering, electrolytic plating, electroless plating process, or other suitable metal deposition process to form individual portions or sections for further interconnectivity. The individual portions of conductive layer 272 can be electrically common or electrically isolated depending on the connectivity of the individual semiconductor die. Conductive layer 272 can be one or more layers of Al, Cu, Sn, Ni, Au, Ag, or other suitable electrically conductive material. Conductive layer 272 includes wettable contact pads for later formation of conductive pillars and UBM fixed relative to the conductive pillars for alignment of the semiconductor die.

An insulating or passivation layer 274 is formed over conductive layers 272 and passivation layer 270 using spin coating, PVD, CVD, printing, sintering, or thermal oxidation. The passivation layer 274 can be one or more layers of SiO2, Si3N4, SiON, Ta2O5, Al2O3, or other material having suitable insulating properties. A portion of passivation layer 274 is removed to expose conductive layer 272.

The structures described in build-up interconnect structure 262 constitute one or more passive circuit elements or IPDs. In one embodiment, conductive layer 264b, resistive layer 266a, insulating layer 268, and conductive layer 272 is a MIM capacitor. Resistive layer 266b is a resistor element in the passive circuit. Other individual sections of conductive layer 272 can be wound or coiled in plan-view to produce or exhibit the desired properties of an inductor.

A plurality of conductive pillars or posts 278 is formed over wettable contact pads of conductive layer 272. In one embodiment, conductive pillars 278 are formed by depositing one or more layers of photoresist over interconnect structure 262. The portion of photoresist over conductive layer 272 is exposed and removed by an etch development process. Conductive material is deposited in the removed portion of the photoresist layer using a selective plating process. The photoresist layer is stripped away leaving behind individual conductive pillars 278. Conductive pillars 278 can be Cu, Al, W, Au, solder, or other suitable electrically conductive material. Conductive pillars 278 have a height ranging from 2-120 μm. In another embodiment, conductive pillars 278 can be formed as stud bumps or stacked bumps. In any case, conductive pillars 278 have a rigid and secure metal-to-metal bonding to conductive layer 272 by solder or IMC containing Cu, Ag, Bi, or Sn.

A plurality of semiconductor die or components 280 is mounted to conductive layer 272 in a flipchip arrangement with metal bumps 284 oriented downward over interconnect structure 262. Semiconductor die 280 includes an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement baseband analog circuits or digital circuits, such as DSP, ASIC, memory, or other signal processing circuit. Semiconductor die 280 may also contain IPD, such as inductors, capacitors, and resistors, for RF signal processing.

An encapsulant or molding compound 288 is deposited over semiconductor die 280 and conductive pillars 278 using a paste printing, compressive molding, transfer molding, liquid encapsulant molding, vacuum lamination, or other suitable applicator. Encapsulant 288 can be polymer composite material, such as epoxy resin with filler, epoxy acrylate with filler, or polymer with proper filler. Encapsulant 288 is non-conductive and environmentally protects the semiconductor device from external elements and contaminants. With metal bumps 284 of semiconductor die 280 securely mounted to conductive layer 272, the die does not shift in alignment with respect to conductive pillars 278 during the encapsulation process.

The encapsulant 288 undergoes grinding or plasma etching to planarize the surface for formation of a topside build-up interconnect structure. In one embodiment, the grinding operation exposes the top surface of conductive pillars 278 and a back surface of semiconductor die 280. Alternatively, the grinding operation exposes the top surface of conductive pillars 278, and leaves semiconductor die 280 embedded within encapsulant 288. The topside build-up interconnect structure 290 is formed over conductive pillars 278, first surface of encapsulant 288, and back surface of semiconductor die 280. An insulating or passivation layer 292 is formed using PVD, CVD, printing, spin coating, spray coating, sintering, or thermal oxidation. The passivation layer 292 can be one or more layers of SiO2, Si3N4, SiON, Ta2O5, Al2O3, or other material having similar insulating and structural properties. A portion of passivation layer 292 is removed by an etching process to expose conductive pillars 278.

An electrically conductive layer 294 is formed over passivation layer 292 and conductive pillars 278 using patterning with PVD, CVD, sputtering, electrolytic plating, electroless plating process, or other suitable metal deposition process. Conductive layer 294 can be one or more layers of Al, Cu, Sn, Ni, Au, Ag, or other suitable electrically conductive material. A portion of conductive layer 294 is electrically connected to conductive pillars 278. Other portions of conductive layer 294 can be electrically common or electrically isolated depending on the design and function of the semiconductor device.

An insulating or passivation layer 296 is formed over insulating layer 292 and conductive layer 294 using PVD, CVD, printing, spin coating, spray coating, sintering, or thermal oxidation. The passivation layer 296 can be one or more layers of SiO2, Si3N4, SiON, Ta2O5, Al2O3, or other material having similar insulating and structural properties. A portion of passivation layer 296 is removed by an etching process to expose conductive layer 294.

The temporary carrier is removed by chemical wet etching, plasma dry etching, mechanical peel-off, CMP, mechanical grinding, thermal bake, laser scanning, or wet stripping. Encapsulant 288 provides structural support for semiconductor device 260 after removal of the carrier. Conductive layer 264 is exposed following removal of the carrier.

An insulating or passivation layer 300 is formed over conductive layer 272 and insulating layer 274 using PVD, CVD, printing, spin coating, spray coating, sintering, or thermal oxidation. The passivation layer 300 can be one or more layers of SiO2, Si3N4, SiON, Ta2O5, Al2O3, or other material having similar insulating and structural properties. A portion of passivation layer 300 is removed by an etching process to expose conductive layer 272.

An electrically conductive layer 298 is formed over conductive layer 272 using patterning with PVD, CVD, sputtering, electrolytic plating, electroless plating process, or other suitable metal deposition process. Conductive layer 298 can be one or more layers of Al, Cu, Sn, Ni, Au, Ag, or other suitable electrically conductive material. Portions of conductive layer 298 are electrically connected to conductive pillars 278 and conductive layer 272. Other portions of conductive layer 298 can be electrically common or electrically isolated depending on the design and function of the semiconductor device.

An electrically conductive bump material is deposited over conductive layer 298 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 298 using a suitable attachment or bonding process. In one embodiment, the bump material is reflowed by heating the material above its melting point to form spherical balls or bumps 302. In some applications, bumps 302 are reflowed a second time to improve electrical contact to conductive layer 298. The bumps can also be compression bonded to conductive layer 298. Bumps 302 represent one type of interconnect structure that can be formed over conductive layer 298. The interconnect structure can also use bond wires, conductive paste, stud bump, micro bump, or other electrical interconnect.

A semiconductor die or component 304 is mounted to a backside of semiconductor device 260 in a flipchip arrangement with metal bumps 306 electrically connected to conductive layer 298. Semiconductor die 304 includes an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement baseband analog circuits or digital circuits, such as DSP, ASIC, memory, or other signal processing circuit. Semiconductor die 304 may also contain IPD, such as inductors, capacitors, and resistors, for RF signal processing. An underfill material 308 is deposited under semiconductor die 304.

Conductive pillars 278 provide vertical, z-direction interconnect between bottom-side build-up interconnect layer 262 and top-side build-up interconnect layer 290. Conductive layer 294 is electrically connected through conductive pillars 278 to conductive layer 272 and metal bumps 284 of semiconductor die 280, as well as conductive layer 264, metal bumps 306 of semiconductor die 304, and the IPD in interconnect layer 262.

As described above, the IPD structure can be formed in either or both of the topside build-up interconnect structure and bottom-side build-up interconnect structure. In addition, two or more semiconductor die can be stacked or mounted side-by-side between the conductive pillars. Other semiconductor die, discrete components, and packages can be mounted to the topside build-up interconnect structure and bottom-side build-up interconnect structure using second level interconnects.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a temporary carrier;
   forming a first conductive layer over the temporary carrier;
   forming an under bump metallization (UBM) layer over the temporary carrier, the UBM layer being fixed in position relative to the first conductive layer;
   forming a conductive pillar over the first conductive layer;
   mounting a semiconductor die to the UBM layer to align the semiconductor die relative to the conductive pillar;
   depositing an encapsulant over the semiconductor die and around the conductive pillar, the UBM layer preventing shifting of the semiconductor die while depositing the encapsulant;
   removing the temporary carrier;
   forming a first interconnect structure over a first surface of the encapsulant; and
   forming a second interconnect structure over a second surface of encapsulant opposite the first interconnect structure, the first and second interconnect structures being electrically connected through the conductive pillar.

2. The method of claim 1, wherein the first interconnect structure includes an integrated passive device electrically connected to the conductive pillar.

3. The method of claim 1, further including removing a portion of the encapsulant to form a planar surface for the first interconnect structure.

4. The method of claim 3, wherein removing the portion of the encapsulant exposes the conductive pillar while leaving the semiconductor die embedded within the encapsulant.

5. The method of claim 1, further including:
   stacking a plurality of the semiconductor devices; and
   electrically connecting the semiconductor devices through the conductive pillar.

6. The method of claim 1, wherein forming the first interconnect structure includes:
   forming a second conductive layer electrically connected to the conductive pillar;
   forming a first insulating layer over first conductive layer; and
   forming a third conductive layer over the second conductive layer, the third conductive layer being electrically connected to the conductive pillar.

7. A method of making a semiconductor device, comprising:
   providing a temporary carrier;
   forming a first conductive layer over the temporary carrier;
   forming an under bump metallization (UBM) layer over the temporary carrier, the UBM layer being fixed in position relative to the first conductive layer;
   forming a conductive pillar over the first conductive layer;
   mounting a semiconductor component to the UBM layer to align the semiconductor component relative to the conductive pillar;
   depositing an encapsulant over the semiconductor component and around the conductive pillar;
   removing the temporary carrier;
   forming a first interconnect structure over a first surface of the encapsulant; and
   forming a second interconnect structure over a second surface of encapsulant opposite the first interconnect structure, the first and second interconnect structures being electrically connected through the conductive pillar.

8. The method of claim 7, wherein the UBM layer prevents shifting of the semiconductor component while depositing the encapsulant.

9. The method of claim 7, wherein the first interconnect structure includes an integrated passive device electrically connected to the conductive pillar.

10. The method of claim 7, further including removing a portion of the encapsulant to form a planar surface for the first interconnect structure.

11. The method of claim 10, wherein removing the portion of the encapsulant exposes the conductive pillar while leaving the semiconductor component embedded within the encapsulant.

12. The method of claim 7, further including:
    stacking a plurality of the semiconductor devices; and
    electrically connecting the semiconductor devices through the conductive pillar.

13. The method of claim 7, wherein forming the first interconnect structure includes:
    forming a second conductive layer electrically connected to the conductive pillar;
    forming a first insulating layer over the first conductive layer; and
    forming a third conductive layer over the second conductive layer, the third conductive layer being electrically connected to the conductive pillar.

14. A method of making a semiconductor device, comprising:
    forming a first interconnect structure including wettable contact pads and an under bump metallization (UBM) fixed in position relative to the contact pads;
    forming a conductive pillar over the wettable contact pads of the first interconnect structure;
    mounting a first semiconductor component to the UBM to align the semiconductor component relative to the conductive pillar;
    depositing an encapsulant over the semiconductor component and around the conductive pillar; and
    forming a second interconnect structure over a first surface of the encapsulant opposite the first interconnect structure, the first and second interconnect structures being electrically connected through the conductive pillar.

15. The method of claim 14, wherein the UBM layer is fixed in position relative to the conductive pillar and prevents shifting of the semiconductor component while depositing the encapsulant.

16. The method of claim 14, wherein the first interconnect structure includes an integrated passive device electrically connected to the conductive pillar.

17. The method of claim 16, wherein the integrated passive device includes a capacitor, resistor, or inductor.

18. The method of claim 14, further including a second semiconductor component mounted to the first interconnect structure opposite the first semiconductor component.

19. The method of claim 14, further including removing a portion of the encapsulant to form a planar surface for the second interconnect structure.

20. The method of claim 14, further including:
stacking a plurality of the semiconductor devices; and
electrically connecting the semiconductor devices through the conductive pillar.

21. A semiconductor device, comprising:
a first conductive layer;
an under bump metallization (UBM) layer fixed in position relative to the first conductive layer;
a conductive pillar formed over the first conductive layer;
a semiconductor component mounted to the UBM layer to align the semiconductor die relative to the conductive pillar;
an encapsulant deposited over the semiconductor die and around the conductive pillar;
a first interconnect structure formed over a first surface of the encapsulant; and
a second interconnect structure formed over a second surface of encapsulant opposite the first interconnect structure, the first and second interconnect structures being electrically connected through the conductive pillar.

22. The semiconductor device of claim 21, wherein the UBM layer prevents shifting of the semiconductor die while depositing the encapsulant.

23. The semiconductor device of claim 21, wherein the first interconnect structure includes an integrated passive device electrically connected to the conductive pillar.

24. The semiconductor device of claim 21, wherein the second interconnect structure includes an integrated passive device electrically connected to the conductive pillar.

25. The semiconductor device of claim 21, further including a plurality of stacked semiconductor devices electrically connected through the conductive pillar.

* * * * *